(12) United States Patent
Moghe et al.

(10) Patent No.: US 6,645,790 B2
(45) Date of Patent: Nov. 11, 2003

(54) SYSTEM AND METHOD FOR PROTOTYPING AND FABRICATING COMPLEX MICROWAVE CIRCUITS

(75) Inventors: Sanjay B. Moghe, Atlanta, GA (US); Carl S. Chun, Atlanta, GA (US); Pranav N. Patel, Decatur, GA (US); Seung-yup Yoo, Dunwoody, GA (US)

(73) Assignee: Anadigics, Inc., Warren, NJ (US)

( * ) Notice: Subject to any disclaimer, the term of this patent is extended or adjusted under 35 U.S.C. 154(b) by 0 days.

(21) Appl. No.: 10/032,321

(22) Filed: Dec. 21, 2001

(65) Prior Publication Data

US 2002/0110942 A1 Aug. 15, 2002

Related U.S. Application Data

(60) Provisional application No. 60/347,966, filed on Nov. 7, 2001, and provisional application No. 60/259,505, filed on Jan. 3, 2001.

(51) Int. Cl.[7] .......................... H01L 21/00; H01L 21/66; H01L 21/44; H01L 21/48; G01R 31/26
(52) U.S. Cl. .......................... 438/107; 438/17; 438/110; 438/64; 438/67
(58) Field of Search ................................ 438/107, 108, 438/110, 64, 65, 66, 67, 17; 257/275

(56) References Cited

U.S. PATENT DOCUMENTS

| | | | |
|---|---|---|---|
| 4,737,236 A | | 4/1988 | Perko et al. |
| 5,132,648 A | * | 7/1992 | Trinh et al. .................. 333/128 |
| 5,428,327 A | | 6/1995 | Bahl |
| 5,446,424 A | * | 8/1995 | Pierro ......................... 333/104 |
| 5,510,758 A | | 4/1996 | Fujita et al. |
| 5,611,008 A | | 3/1997 | Yap |
| 5,639,683 A | * | 6/1997 | Reyes ........................... 437/60 |
| 5,689,138 A | | 11/1997 | Dekker et al. |
| 5,717,245 A | | 2/1998 | Pedder |
| 5,717,249 A | * | 2/1998 | Yoshikawa et al. ......... 257/728 |
| 5,903,239 A | | 5/1999 | Takahashi et al. |
| 5,933,707 A | * | 8/1999 | Ayliffe et al. ................ 438/107 |
| 6,380,623 B1 | * | 4/2002 | Demore ....................... 257/723 |
| 6,414,371 B1 | * | 7/2002 | Freeman et al. ............. 257/584 |
| 2002/0037598 A1 | * | 3/2002 | Koh ............................. 438/27 |

OTHER PUBLICATIONS

Gregus et al. "Chip Scale Modules for High–Level Integration in the 21st Century," Bell Labs Technical Journal, Jul.–Sep. 1998, published at http://www.sychip.com/PUB/tech_journal.pdf.*
US 2002/0011354 A1 Barnett et al., Published Jan. 31, 2002.
International Search Report for PCT/US01/497 10, Mailed on Aug. 2, 2002.
RF Integration Products, published at http://www.sychip.com/30–rf.html, copright 2000 by SyChip, Inc.
"Chip–Scale Modules for High–Level Integration in the 21st Century," J.A. Gregus, M.Y. Lau, Y. Degani and K.L. Tai, Bell Labs Technical Journal, Jul.–Sep. 1998, published at http://www.sychip.com/PUB/tech_journal.pdf.
GPS 2020 Receiver Module for Wireless Internet Appliances, http://www.sychip.com/gps–module.html, copyright 2000 by SyChip, Inc.

* cited by examiner

*Primary Examiner*—John F. Niebling
*Assistant Examiner*—Viktor Simkovic
(74) *Attorney, Agent, or Firm*—Tucker Ellis & West LLP

(57) ABSTRACT

The present invention is generally drawn to a system and method for creating RF integrated microwave circuits that can support multiple applications where many RF functions can be derived from a generic integrated circuit after the RF integrated microwave circuit is manufactured. More specifically, the present invention can provide active and passive device building blocks of respective monolithic microwave integrated circuit (MMIC) arrays and substrates that can be coupled together in various ways after manufacture of the integrated circuits to achieve multiple applications. This can accomplished by manufacturing chips with multiple active device blocks that can support various and multiple applications and that can be coupled together in various ways, adjusted, or tuned after manufacture.

18 Claims, 14 Drawing Sheets

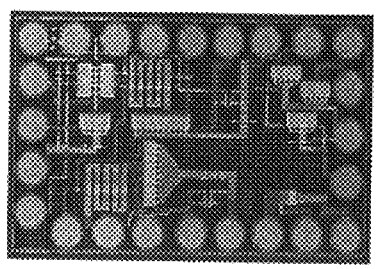
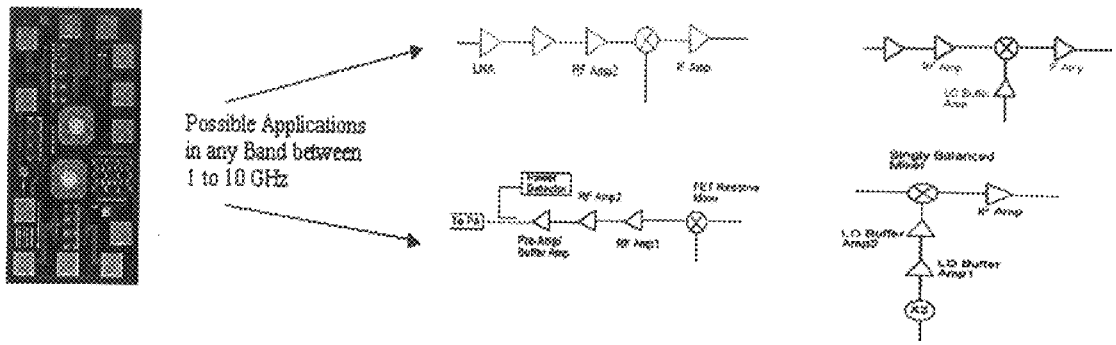
Die Size : SiGe HBT
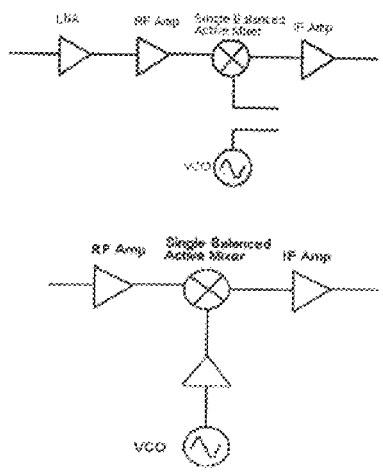
*Fig. 11*
*Fig. 12*

SYSTEM AND METHOD FOR PROTOTYPING AND FABRICATING COMPLEX MICROWAVE CIRCUITS

STATEMENT REGARDING RELATED APPLICATIONS

The present application claims priority to the following provisional patent applications: provisional patent application entitled, "System and Method for Prototyping Complex Microwave Circuits," filed on Jan. 3, 2001 and assigned U.S. Application Serial No. 60/259,505; and provisional patent application entitled, "Packaging of Microwave Integrated Circuitry in Multi-Chip Module," filed on Nov. 7, 2001 and assigned U.S. Application Serial No. 60/347,966.

TECHNICAL FIELD

The present invention is generally directed to prototyping and fabricating complex circuits for radio frequency (RF) and microwave frequency ranges. More particularly described, the present invention uses the combination of an optimized monolithic microwave integrated circuit (MMIC) and a single layer or multilayer substrate, such as a conventional alumina substrate, a low temperature co-fired ceramic (LTCC) substrate, a printed circuit board (PCB), a high temperature co-fired ceramic (HTCC), a hybrid ceramic-organic substrate, or a glass substrate, to reduce the conventional time period for fabrication and testing of prototype microwave integrated circuits.

BACKGROUND OF THE INVENTION

Electronic circuits typically comprise active components and passive components. Typical active components comprise transistors, such as field effect transistors (FETs), bipolar junction transistors (BJTs), and diodes. Passive components typically comprise inductors, capacitors, resistors, and, for high frequencies, transmission lines. A circuit designer can design a functional circuit block by combining active and passive components in a specified configuration. In turn, the circuit designer can combine various functional circuit blocks to realize a more complex circuit design.

An integrated circuit comprises circuits placed upon a single semiconductor substrate. A circuit designer can design a discrete integrated circuit by using numerous components, each having a single dedicated function, such as a transistor, wire-wound inductor, or carbon film resistor. In contrast, a circuit designer can design a hybrid integrated circuit by using only a few components, each typically comprising a complex function. A circuit designer can use both active and passive components for fabrication on a semiconductor substrate. However, selected substrate materials, such as ceramic, are useful only for a placement of passive components (not transistors).

The ongoing computer evolution has pushed the design of digital circuits to an increasingly higher level of circuit integration. Likewise, the growing trend of wireless mobile communications has encouraged designers to create RF and microwave frequency circuits that can be housed within increasingly smaller circuit packages. Highly integrated circuit designs achieve the benefits of smaller circuit size, improved circuit matching, precise control of component layout, and the availability of multiple active components within a small design package. Highly integrated circuit designs also achieve increased circuit repeatability and reliability over corresponding discrete circuit implementations.

Designers of highly integrated digital circuits and RF and microwave circuits face different circuit design and layout criteria. A designer can achieve a highly integrated circuit for a digital application based largely upon the use of active components to achieve a monolithic implementation. In contrast, a designer of highly integrated circuits for RF and microwave frequency applications, typically 100 MHz–10 GHz, faces the design challenge of using matching circuits comprising passive components that consume a large portion of the available semiconductor real estate. For example, at lower frequencies, the passive components can consume more semiconductor "real estate" than active components. Consequently, RF and microwave circuit designers faced additional circuit layout challenges as a result of the amount of semiconductor real estate consumed by passive components for matching the impedances of active components.

In addition to circuit layout challenges, an RF and microwave circuit designer also faces extended fabrication times to implement and test a design prototype. For example, current microwave circuit semiconductor technology typically requires 6–8 weeks of foundry processing to achieve a design fabrication. If multiple design passes are required to satisfy performance requirements, an MMIC design may require up to 8 to 16 months of integrated circuit development and foundry time. An alternative design approach requires the use of multiple separate integrated circuits to achieve a single function, where the separate circuits are fabricated in parallel to expedite processing time. Neither approach provides a suitable adaptable design that achieves the short processing times dictated by the rapidly changing demands of the wireless mobile communication marketplace.

In view of the foregoing, there is a need in the RF and microwave frequency design art for a technique to develop MMICs in short fabrication processing time periods. In addition, there is a need in the relevant design art for a technique to achieve adaptable designs for satisfying a variety of application requirements in an efficient and timely manner. The present invention satisfies these and other needs of the prior art based upon the innovative combination of an MMIC array and a multilayer substrate, such as a conventional alumina substrate, an LTCC substrate, a PCB equivalent, an HTCC substrate, a hybrid ceramic-organic substrate, or a glass substrate. The present invention can use an MMIC array to achieve different functional circuit blocks based upon interconnection and design changes to the multilayer substrate, which can be fabricated on a relatively quick turn-around period.

SUMMARY OF THE INVENTION

The present invention is generally drawn to a system and method for creating RF integrated microwave circuits that can support multiple applications where many RF functions can be derived from a generic integrated circuit after the integrated circuit is manufactured. More specifically, the present invention can provide active and passive device building blocks of respective monolithic microwave integrated circuit (MMIC) arrays and substrates that can be coupled together in various ways after manufacture of the integrated circuits to achieve multiple applications. One objective of the present invention is to generally reduce the amount of time needed to manufacture RF integrated microwave circuits. This can be accomplished by manufacturing chips with multiple active device blocks that can support various and multiple applications and that can be coupled together in various ways, adjusted, or tuned after manufacture.

Active device blocks of the present invention may include, but are not limited to, transistors, such as field effect transistors (FETs), bipolar junction transistors (BJTs), and diodes. Passive device blocks may include, but are not limited to, inductors, capacitors, resistors, and, for high frequencies, transmission lines.

The present invention can be characterized as a "tool set" where the tools can comprise a plurality of active device blocks disposed in an integrated circuit that can be selected by a user after the integrated circuit is manufactured. That is, integrated circuits of the present invention can comprise a first set of active device blocks that can be selected and coupled together to support a desired RF function. Meanwhile, a second set of the active device blocks can remain uncoupled from the first set since the second set of active device blocks may not be needed for a current desired RF function, but the second set of active device blocks can be used for a future RF function.

However, the present invention is not limited to an exemplary embodiment that comprises a first set of active device blocks that are used and a second set of active device blocks that remain unused. It is possible in another exemplary embodiment that all of the active device blocks are coupled together to achieve a desired RF function while unused active device blocks do not exist.

Unlike conventional monolithic microwave integrated circuits which usually couple all active device blocks together, the present invention permits a user to selectively couple active device blocks together while leaving some of the active device blocks uncoupled after the monolithic microwave circuit has been manufactured. This means, that the present invention can support various RF applications even after fabrication of the integrated circuit.

The present invention can eliminate traditional steps in the RF integrated microwave circuit design process. For example, the present invention can eliminate that steps where a user selects desired active and passive device blocks and waits for a foundry to form the integrated circuit that comprises the active and passive device blocks.

In one exemplary embodiment of the present invention, all active device blocks can be placed on a single integrated circuit chip while all passive device blocks can be placed on one or more substrates. The passive blocks can be coupled to corresponding active device blocks on the integrated circuit chip with bond wires and bond pads that may be present on both the substrates and integrated circuit chip.

In another exemplary embodiment, all active device blocks and one or more critical passive device blocks can be placed on a single integrated circuit chip while remaining passive device blocks that are not considered to be critical can be positioned on one or more substrates. A critical passive device block can comprise passive device blocks that require relatively short bond wire lengths to achieve a desired performance level. In other words, a critical passive device block may comprise a passive device block that cannot tolerate performance degradation that can occur because of a bond wire connections that would be needed if the passive device block was placed on a substrate and not on an integrated circuit chip.

In another exemplary embodiment, multiple applications for a contemplated RF integrated microwave circuit can be selected. The multiple applications can comprise primary and secondary applications. Next, a number of primary applications are selected that reduces an amount of the secondary applications. In other words, in this exemplary embodiment, a smaller set of applications can be selected within the larger set of multiple applications that is usually contemplated in other exemplary embodiments. In this exemplary embodiment, the "tool set" as described above can be smaller than the "tool set" described in other exemplary embodiments. Also, in this reduced size "tool set" embodiment, more performance details can be considered when selecting the active device blocks. For example, for each active and passive device block, frequency ranges or bands can be assessed for the selected, reduced set of applications for the RF integrated microwave circuit.

BRIEF DESCRIPTION OF THE DRAWINGS

FIG. 11 illustrates an exemplary die designed on GaAs technology according to the alternative exemplary embodiment of the present invention.

FIG. 12 illustrates another exemplary die designed in SiGe according to an alternative exemplary embodiment of the present invention.

DETAILED DESCRIPTION OF THE EXEMPLARY EMBODIMENTS

The present invention provides a technique for quickly prototyping and fabricating complex RF and microwave integrated circuits based upon the use of an MMIC array and a single layer or multilayer substrate, such as a conventional alumina substrate, an LTCC substrate, a PCB equivalent, an HTCC substrate, a hybrid ceramic-organic substrate, or a glass substrate. The MMIC array typically comprises active components and selective passive components, as required, to achieve an integrated circuit. A representative multilayer substrate, such as the LTCC ceramic substrate, contains the remaining passive components required to implement the integrated circuit. Adaptable designs can be achieved by placing generic function circuits on the MMIC array and selecting appropriate interconnections to the passive components of the LTCC substrate to achieve desired matching, biasing, and filtering functions. Significantly, the present invention offers the flexibility of developing a wide range of RF and microwave functions in a relatively short processing time, typically 2 to 4 months, based upon the use of an MMIC array with different multilayer substrates.

To optimize the layout for an MMIC array, the designer places the active components on the array such that they can be easily and repeatedly attached via interconnections to the multilayer substrate. For an adaptable design approach supporting multiple applications, the designer can place a sufficient number of active components, typical transistors and diodes, on the MMIC array to achieve different functional designs. A designer preferably places these active components on the MMIC layout in a manner that minimizes interference effects arising from parasitics and crosstalk. Crosstalk can be minimized by reducing long trace lengths from the transistors of the MMIC to wirebond pads. A backside via may be centrally placed in the MMIC layout to reduce parasitic elements between transistors and ground.

Those skilled in the art would appreciate that FET size can be critical to a microwave circuit design because it determines gain, matching, current consumption, power output, maximum input power, and frequency of operation. The designer can design the size of a FET to be variable after fabrication to support the adjustment of transistor characteristics. For example, the variability of gate size for a FET can be achieved by the use of multiple "fingers" that can be adjusted after fabrication of the MMIC.

Figure 1A:
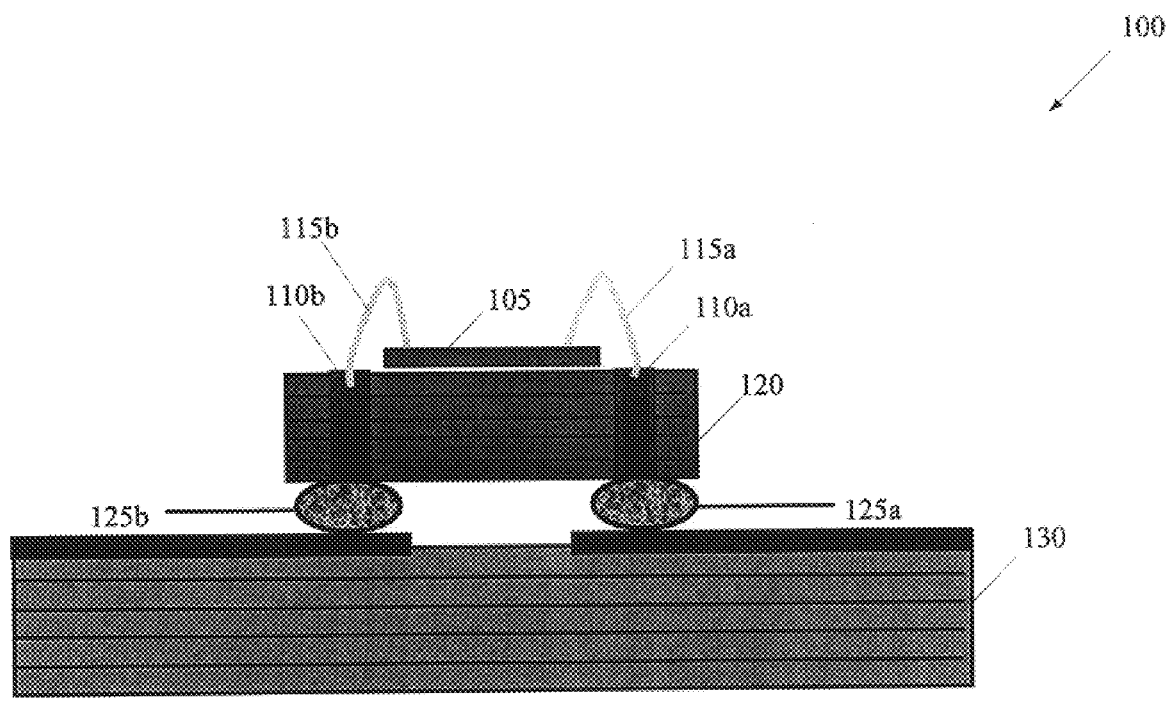
FIG. 1A is a cut-away, side view of the functional components of an integrated circuit for RF and microwave applications constructed in accordance with an exemplary embodiment of the present invention.

Turning now to drawings, in which like reference numbers are used for like elements, FIG. 1A provides a cut-away, side view of the primary components of a microwave integrated circuit design constructed in accordance with an exemplary embodiment of the present invention. Although the following discussion of the invention focuses on the exemplary use of an LTCC substrate for the microwave circuit, those skilled in the art will appreciate that other types of multilayer substrates are encompassed by the invention. For example, other representative multilayer substrates include alumina substrates, PCBs or their equivalents, HTCC substrates, hybrid ceramic-organic substrates and glass substrates.

Referring now to FIG. 1A, an exemplary microwave circuit 100 comprises an MMIC 105 coupled to an LTCC substrate 120 via conductive paths 115a and 115b. The conductive paths 115a and 115b are typically implemented by metallic wires extending from wirebond pads on the MMIC 105 to plated-through vias 110a and 110b passing through each layer of the LTCC 120. Solder balls 125a and 125b are positioned between the LTCC substrate 120 and the printed circuit board (PCB) 130. The solder balls 125a and 125b represent conductive connections between traces or plated-through holes on the PCB 130 and the LTCC vias 110a and 110b. In this manner, the microwave circuit(s) formed by the combination of the MMIC 105 and the LTCC substrate 120 can be connected to the PCB 130.

The MMIC 105 comprises an integrated circuit array including the active components of the circuit design and selected passive components as required for performance requirements. In contrast, the LTCC substrate 120 comprises only passive components, typically inductors and capacitors, formed by the ceramic multiple-layer substrate. The design and the placement of the active components on the MMIC array 105 are optimized to support convenient and repeatable attachment to the LTCC substrate 120 via the LTCC vias 110a and 110b. The designer of the MMIC array 105 typically places a sufficient number of active components within the array to support the general functions of various applications. By using multiple fingers for a transistor design, the designer maintains the flexibility of adjusting transistor characteristics after fabrication by using a laser to trim the fingers. In addition, the designer preferably designs a circuit layout of active components on the MMIC array 105 to reduce long traces from the transistors to wirebond pads. For example, a long narrow trace can be placed along the periphery of the MMIC array 105 to support convenient access by active components to wirebond pads based upon the use of short traces. This reduction of the path lengths between active components to the wirebond pads effectively minimizes the generation of parasitic inductances that can result in crosstalk susceptibility of the microwave circuit.

The LTCC substrate 120 typically comprises multiple substrate layers to support complex passive component designs. The multiple layers of the LTCC substrate 120 provide passive components that support matching, biasing and filtering functions. For example, a filter comprising multiple passive components can be economically produced by the use of multiple layers that form a three-dimensional filter structure when the layers are stacked upon each other. The LTCC vias 110a and 110b are formed by the use of plated-through holes in each layer of the LTCC substrate 120, thereby forming a conductive channel extending between the top and bottom LTCC layers.

An LTCC substrate is typically designed and fabricated for a particular circuit application supported by the MMIC 105. In the event that a different application is desired, the designer can design and fabricate another LTCC substrate that provides the necessary interconnections to complete the circuit design. In this manner, different circuit applications can be achieved by the use of a single MMIC array 105 having generic function "building blocks" and multiple LTCC substrates 120 supporting appropriate interconnections. In other words, a wide variety of RF and microwave functions can be achieved in a relatively short fabrication processing time period based upon the use of the same MMIC array 105 with different designs for the LTCC substrate 120.

Figure 1B:
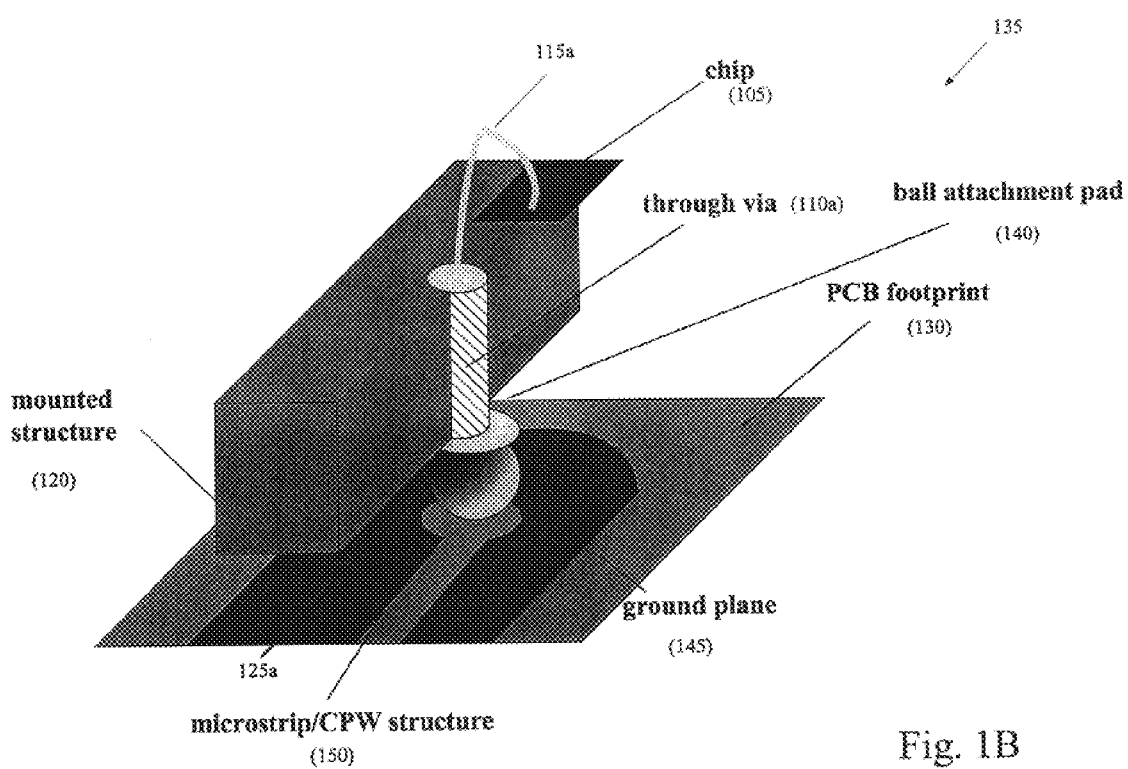
FIG. 1B is a cut-away, perspective view of the components of an integrated circuit for RF and microwave applications constructed in accordance with an exemplary embodiment of the present invention.

FIG. 1B is a cut-away, perspective view of a microwave circuit constructed in accordance with an exemplary embodiment of the present invention. FIG. 1B illustrates a microwave circuit 135 formed by the combination of the MMIC array 105, the LTCC substrate 120 and the PCB 130. The MMIC array 105, referred to as a "chip" in FIG. 1B, is connected to the LTCC via 110a by a conductive path formed by a connecting wire and trace. The LTCC via 110a provides a plated-through channel extending along all layers of the LTCC substrate 120. At the LTCC substrate side opposite the MMIC array 105, a ball attachment pad 140 is attached to the LTCC via 110a. The PCB 130 includes a microstrip/CPW structure 150 that can be connected to the ball attachment pad 140 via the solder ball 125a. For this microwave structure, the LTCC substrate 120 is positioned between the MMIC array 105 and the PCB 130. In particular, the MMIC array 105 is mounted to the LTCC substrate 120 and, in turn, the LTCC substrate 120 is mounted to a ground plane of the PCB 130. A conductive path is completed between the MMIC 105 and the microstrip 150 of the PCB 130 by the combination of the conductive wire (and trace) 115a, the LTCC via 110a, the ball attachment pad 140, and the solder ball 125a.

Figure 1C:
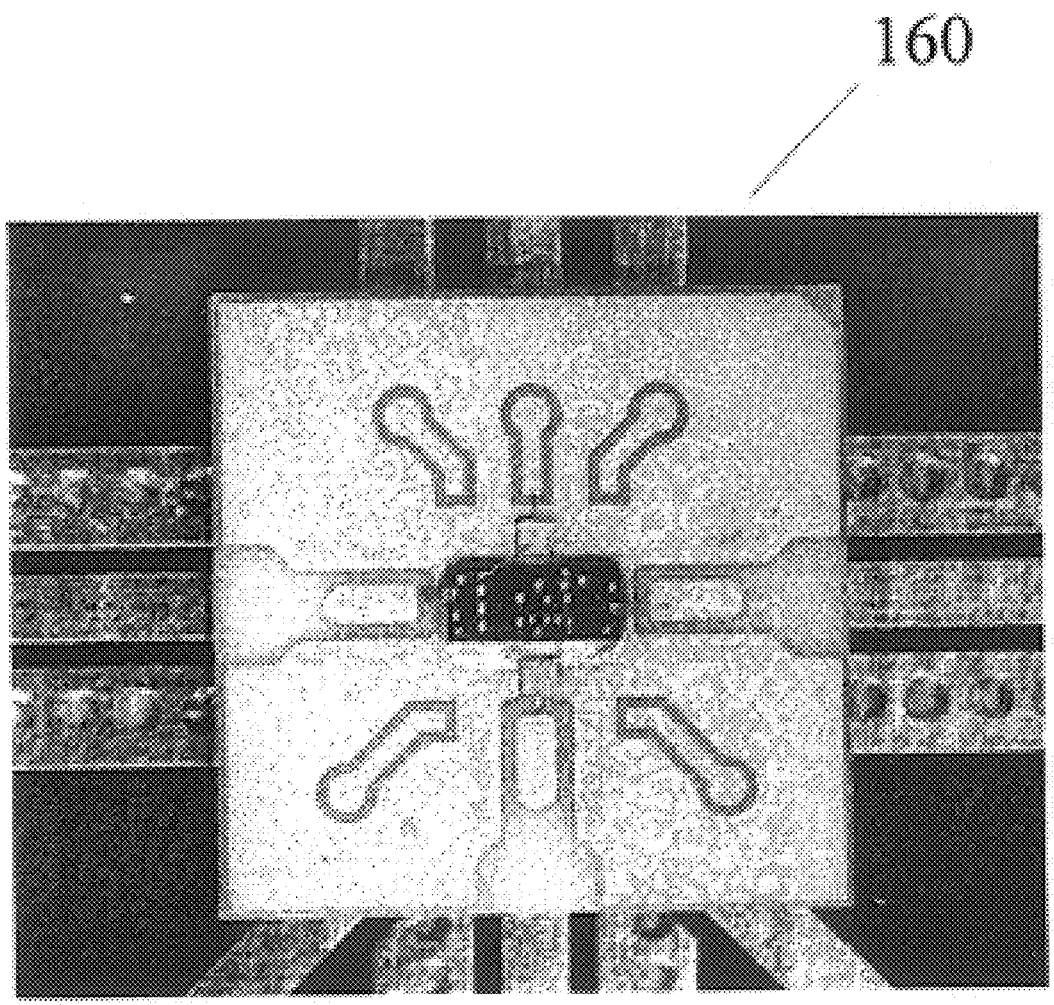
FIG. 1C is a top view of an integrated for RF and microwave applications constructed in accordance with an exemplary embodiment of the present invention.

FIG. 1C is a top view of microwave circuit constructed in accordance with an exemplary embodiment of the present invention. FIG. 1C illustrates a microwave circuit 160 formed by the combination of an MMIC array, an LTCC substrate, and a PCB.

Figure 2:
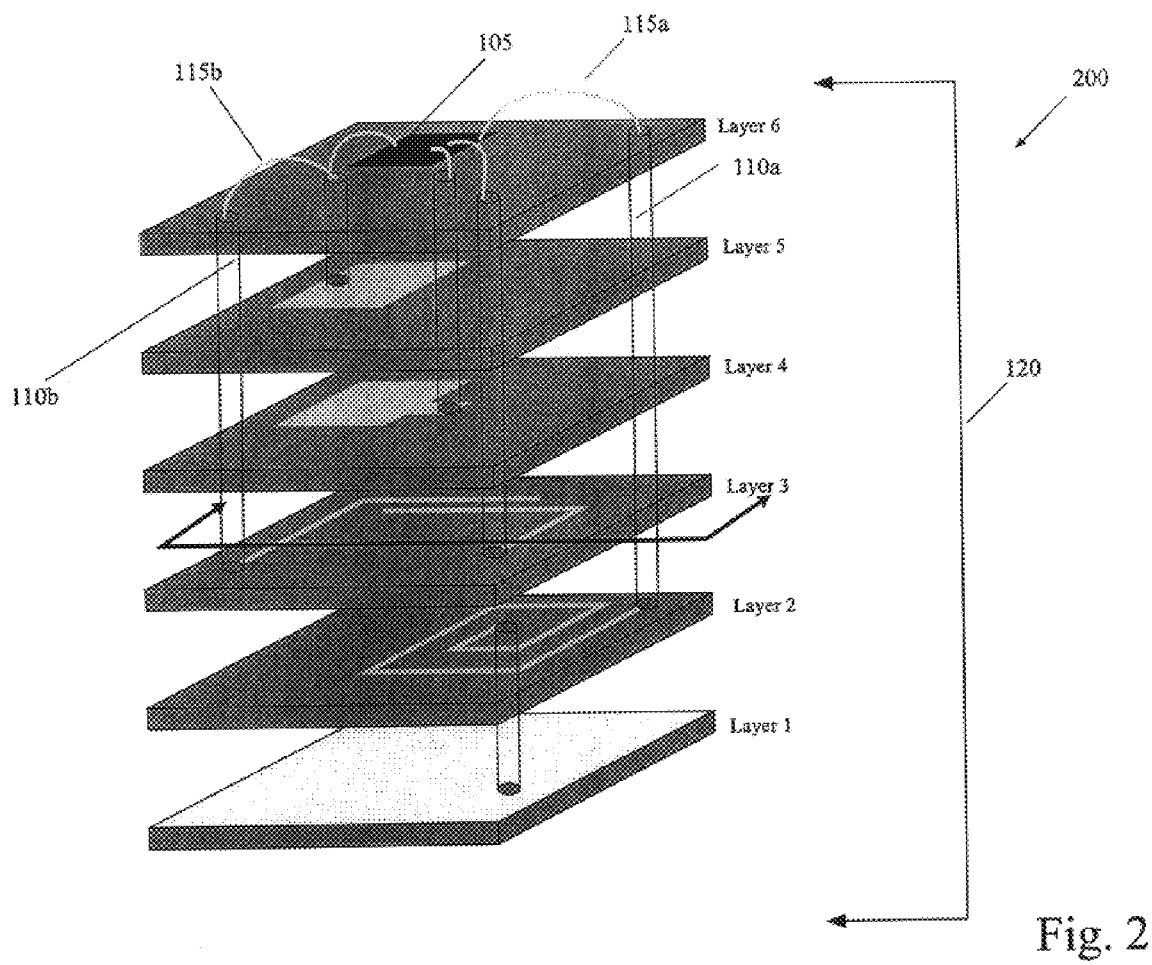
FIG. 2 is an exploded view of the layers of an integrated circuit for RF and microwave applications constructed in accordance with an exemplary embodiment of the present invention.

FIG. 2 is an exploded view of a microwave circuit formed by the combination of an MMIC array and multiple layers of an LTCC substrate in accordance with an exemplary embodiment of the present invention. The exemplary LTCC substrate 120 shown in FIG. 2 comprises six layers, layer 1–layer 6. In contrast to the MMIC array 105, the LTCC layers 1–6 comprise only passive components, typically, capacitors or inductors. The layers 1–6 of the LTCC substrate 120 are stacked upon each other to form the passive components supporting the microwave circuit of the MMIC array 105. The shaded portions of each of the layers 1–6 represent the structure of the passive component layouts. As shown by the vertical cylindrical elements in FIG. 2, the LTCC vias 110a and 110b can extend through the LTCC layers 1–6. The MMIC array 105 is connected to the multiple layers of the LTCC substrate 120 by connecting conductive paths 115a and 115b to LTCC vias 110a and 110b. In addition, plated-through channels can be provided between selected LTCC substrate layers as required to support interconnections between passive component layout structures on different layers.

Figure 3:
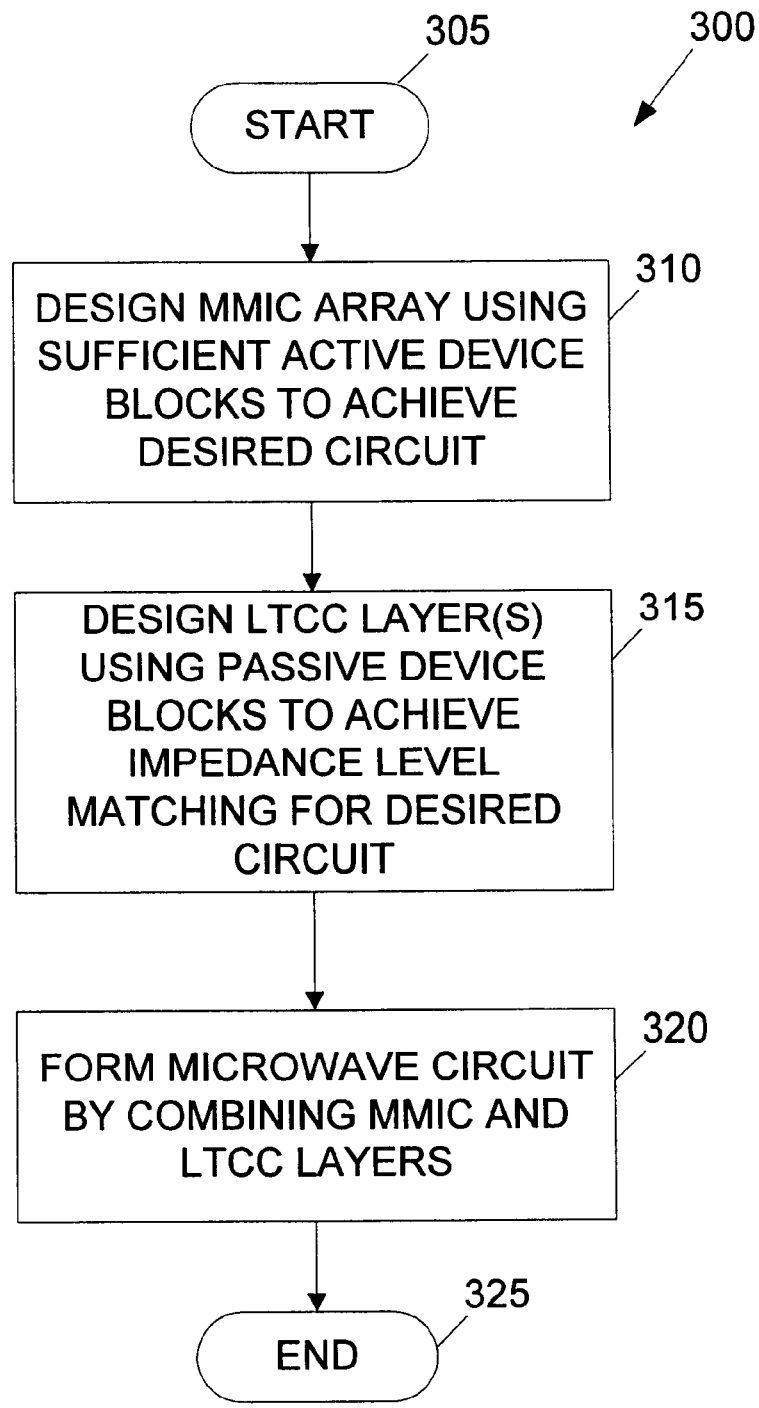
FIG. 3 is a flow chart diagram illustrating the primary tasks of an RF and microwave integrated circuit design process in accordance with an exemplary embodiment of the present invention.

FIG. 3 is a logical flow chart diagram illustrating an exemplary design process for designing and fabricating a microwave integrated circuit. Turning now to FIG. 3, the exemplary design process 300 is initiated at the START step 305 by selecting an application for a desired microwave circuit. In step 310, a designer can design the MMIC array using a sufficient number of active device blocks to achieve a desired circuit.

For example, if the desired circuit is a superheterodyne transceiver, the designer can place a sufficient number of FETs in the circuit layer to implement the transmit and receive functions of the transceiver. The transmit chain of a superheterodyne transceiver can be constructed with four FETs and four diodes to build an IF amplifier, an up-convert mixer, a preamplifier, and a power amplifier. The receive chain can be constructed with a single conversion architecture comprising an IF gain stage, a mixer, and RF gain stage and an low noise amplifier. The same component layout can be used for both transmit and receive chains by adjusting the FET and diode sizes, after fabrication of the MMIC array, and using the proper interconnections to passive components on the LTCC substrate. The designer also can place required passive components as needed on the MMIC array to achieve proper performance of this microwave circuit. However, the majority of passive components will be specified for the LTCC substrate, as described below in connection with step 315.

In step 315, the designer can design the LTCC substrate using multiple layers to achieve the passive design blocks necessary to provide impedance level matching, biasing and filtering for the microwave circuit. In contrast to the MMIC array design in step 310, the LTCC substrate comprises only passive components, typically inductors and capacitors. The layout for the LTCC substrate also comprises plated-through vias to support the interconnection of passive components of the LTCC substrate to the circuit of the MMIC array. Vias also can be used to complete interconnection between passive components on different layers of the LTU substrate.

In step 320, the desired microwave circuit is formed by fabricating the MMIC array and the LTCC substrate and interconnecting these building blocks. The arrangement of active and selected passive components on the MMIC array supports improved device performance and provide increased circuit flexibility. The LTCC substrate comprises passive components that support optimal circuit performance at a lower cost because the design and fabrication time for a typical LTCC substrate comprises only a few weeks.

Figure 4:
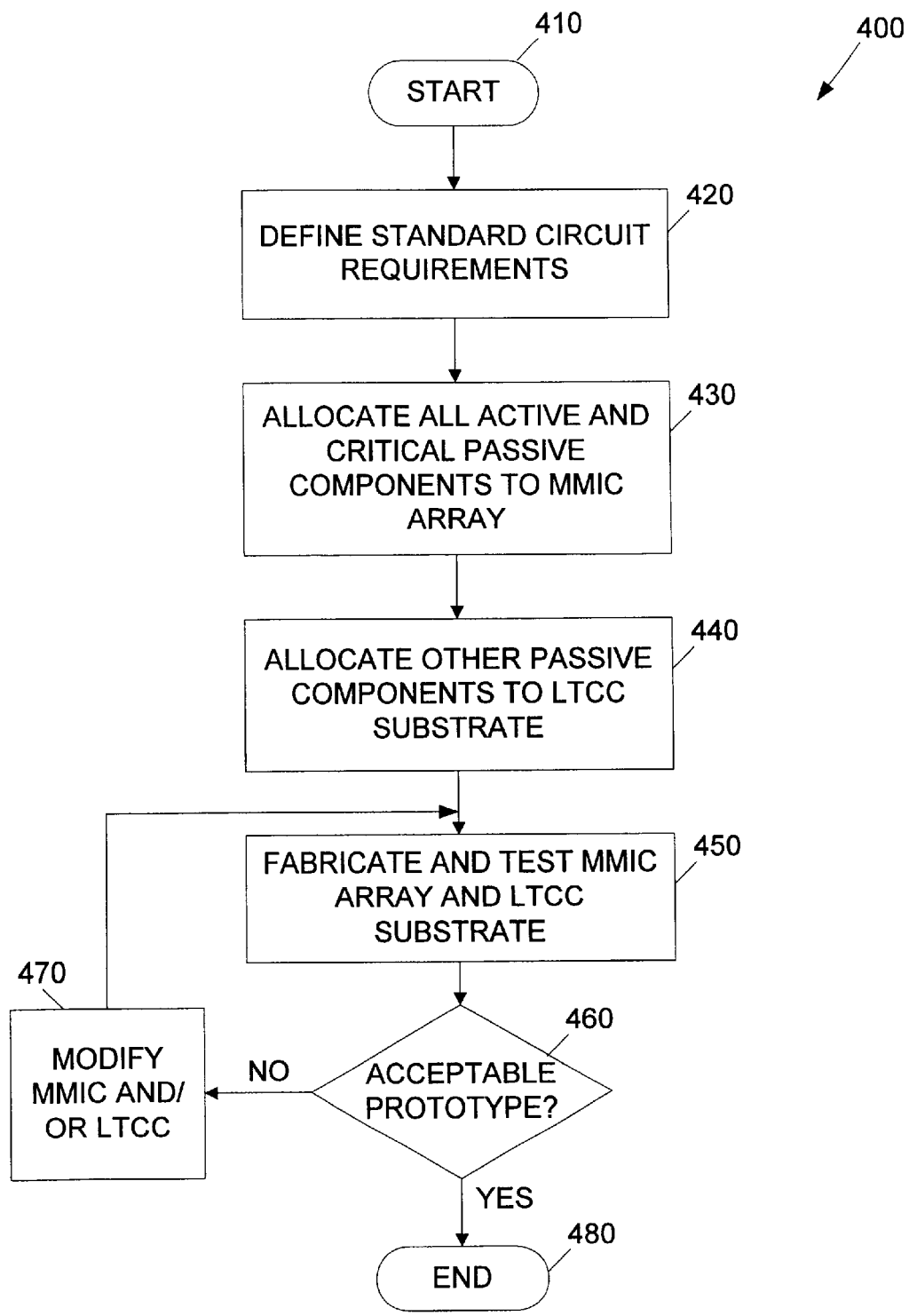
FIG. 4 is a logical flow chart diagram illustrating the steps for an RF and microwave integrated circuit design process in accordance with an exemplary embodiment of the present invention.

FIG. 4 is a flow chart diagram illustrating a design process for developing a microwave circuit comprising an MMIC array and an LTCC substrate in accordance with exemplary embodiment of the present invention. Turning now to FIG. 4, the exemplary design process 400 is initiated at the START step 410 based upon the selection of one or more circuit applications. In step 420, the designer defines the standard circuit requirements for each of the applications based upon the use of active and passive component "building blocks." These building blocks preferably represent generic microwave circuit functions that can be used to support multiple applications based upon adjustments to the circuit design.

In step 430, the designer allocates all active and critical passive components to the MMIC array. The active components, typically FETs and diodes, preferably include multiple finger interconnections to support the adjustment of component size after MMIC fabrication. In addition, the routing of interconnections between the active components and wirebond pads is minimized to reduce the generation of unwanted parasitics and crosstalk among components. High powered active components, such as transistors in a transmit chain, are preferably separated from the remaining active components to minimize the introduction of interference between high power and low power components. These layout options support the creation of an optimal design for the MMIC array.

In step 440, the designer allocates the remaining passive components to the layout for the LTCC substrate. Three-dimensional structures for passive components can be achieved by stacking multiple layers within the LTCC substrate. For example, filter structures can be economically produced by the use of a multiple-layer structure having layered that are stacked upon each other to achieve the desired filtering function. The designer can place plated-through vias within the LTCC substrate to support the interconnection of the MMIC array to the passive components of the LTCC substrate. Additional plated-through vias can be used to interconnect selected layers of a multi-layer LTCC substrate. Although the passive components of the LTCC substrate generally support impedance matching operations, it will be appreciated that biasing and filtering functions also can be supported by these passive components.

In step 450, both the MMIC and the LTCC substrate are fabricated and tested. Individual tests can be completed to separately evaluate the MMIC array and the LTCC substrate. The overall microwave circuit is tested, however, based upon the interconnection of the MMIC array to the LTCC substrate.

In decision step 460, an inquiry is conducted to determine whether the combination of the MMIC array and the LTCC substrate form an acceptable prototype of the microwave circuit. If the response to this inquiry is positive, the "YES" branch is followed from decision step 460 to the END step 480. If the response to the inquiry in decision step 460 is negative, however, the "NO" branch is followed to step 470.

In step 470, the MMIC array and/or the LTCC substrate design is modified to achieve the desired performance of the microwave circuit. Based upon the optimal design features of the MMIC array, the performance of this chip can be modified by adjusting the size of the FETs and diodes. For example, a designer can typically adjust transistor and diode sizes by trimming the finger interconnections forming the layout of these components. This adjustment of the transistor and diode sizes facilitates the use of active "building blocks" for more than one application. Because an LTCC substrate can be fabricated relatively quickly, typically in 1–2 weeks, a designer also can modify the passive component layout of the LTCC substrate to achieve the desired circuit performance. The exemplary design process is based upon the fabrication of a single MMIC array and one or more LTCC substrates, as required, to achieve desired circuit performance. Upon modifying either the MMIC array and/or fabricating a new LTCC substrate, a loop is followed from step 470 to step 450 and the design process begin anew.

Figure 5A:
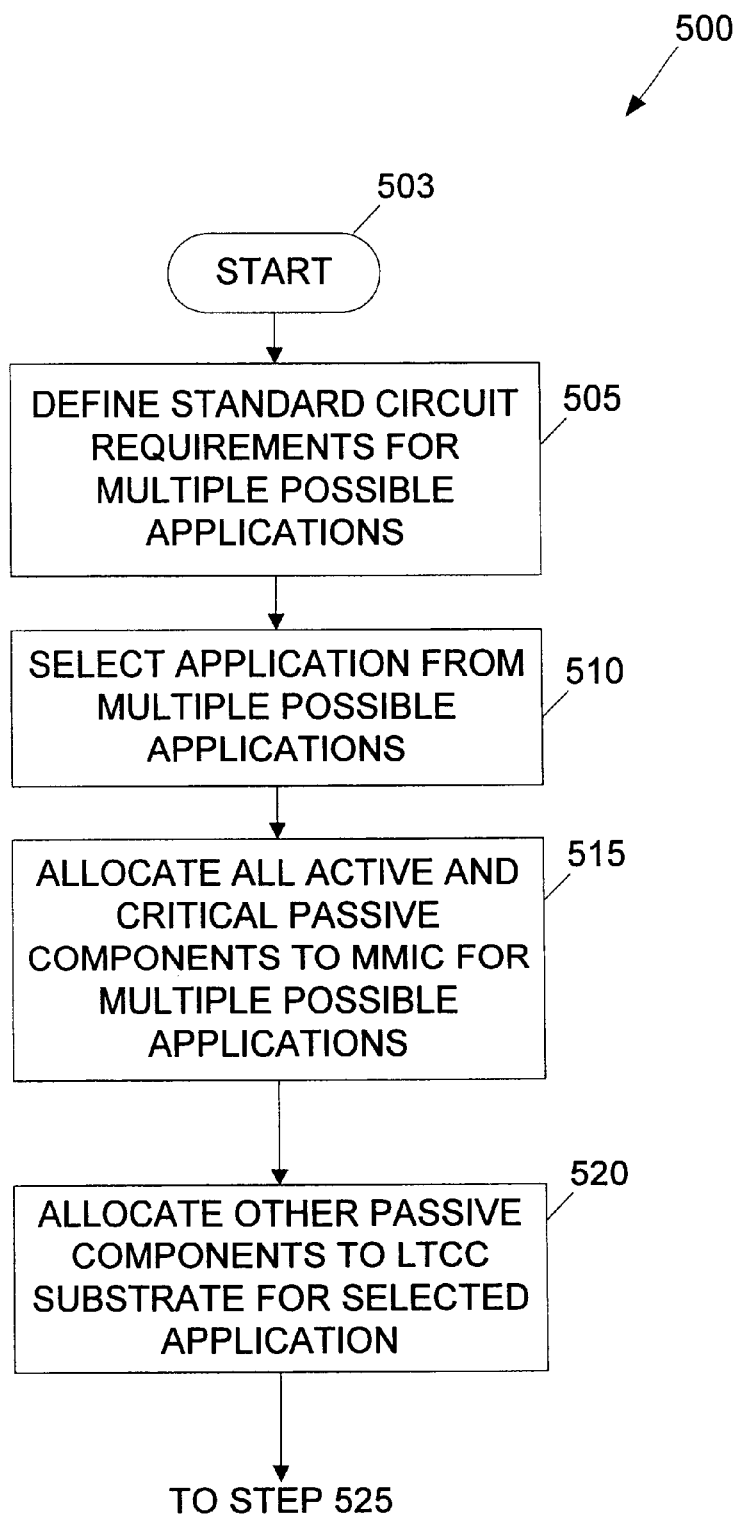
FIGS. 5A and 5B, collectively described as FIG. 5, are flow chart diagrams illustrating the steps for an adaptable design process to achieve RF and microwave integrated circuit designs for multiple applications in accordance with an alternative exemplary embodiment of the present invention.
Figure 5B:
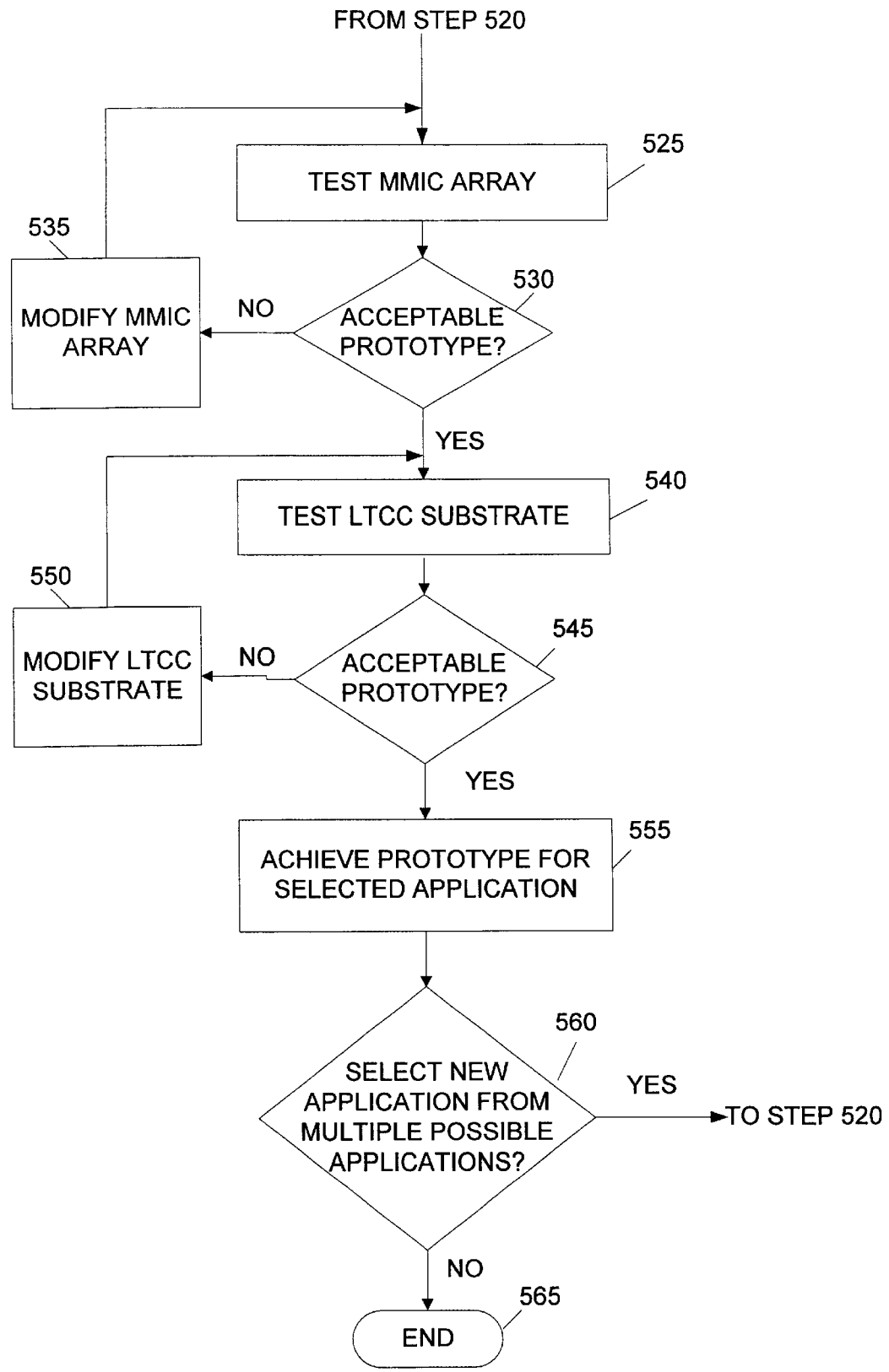

FIG. 5, comprising FIGS. 5A and 5B, is a logical flow chart diagram illustrating the steps for designing and fabricating a microwave circuit in accordance with an alternative exemplary embodiment of the present invention. Referring now to FIG. 5, the design process 500 is initiated at the START step 503 with the objective of designing, fabricating, and testing a monolithic microwave integrated circuit capable of supporting one or more applications. In step 505, the designer defines the standard circuit requirements or "building" blocks necessary to achieve the possible circuit applications identified in step 503. For example, a designer facing the design challenge of creating a microwave circuit capable of supporting both a receive application and a transmit application will optimize the circuit layout by using a sufficient number of components to achieve both applications within the same MMIC array. This allows the MMIC array to be used for either application (or both) by combining that array with an appropriate LTCC substrate providing circuit interconnections for matching, biasing, and filtering functions.

In step 510, the designer selects a particular application from the possible applications for the microwave circuit. In turn, the designer in step 515 allocates all active and critical passive components to the MMIC array for the possible set of applications. The design objective in step 515 is to achieve a circuit layout with a sufficient number of active and passive components to support multiple possible applications. To conserve semiconductor "real estate", the circuit designs for the possible applications preferably include at least a subset of identical "building block" components.

In step 520, the designer allocates all remaining passive components to the LTCC substrate for the selected application. In contrast to step 515, the designer is focusing upon a selected application for the circuit design rather than multiple possible applications. The LTCC substrate can be constructed from multiple stacked substrate layers as required to implement three-dimensional passive component structures, such as complex filtering structures.

In step 525, the MMIC array is tested to evaluate its performance in view of design specifications. A decision is made in step 530 whether the prototype for the MMIC array is acceptable based upon performance criteria. If the response to the inquiry in the decision step 530 is negative, the "NO" branch is followed to step 535. The designer in step 535 has the option of modifying the circuit components of the MMIC array or designing (or fabricating) a new MMIC array. The designer can modify the MMIC array by adjusting the size of selected transistors of the MMIC array. For example, the designer can use a laser to trim finger interconnections of the gate of a FET to modify the performance of that transistor. Upon completing the modification for a new design for the MMIC array, a loop is followed from step 535 to step 525 and the process begins anew.

If the response to the inquiry in decision step 530 is positive, the "YES" branch is followed to step 540. The designer tests the LTCC substrate in step 540 to evaluate its performance against design specifications. If the LTCC substrate is acceptable, the "YES" branch is followed from decision step 545 to step 555. A negative response to the inquiry in decision step 545 results in a designer's decision to modify the circuit layout of the LTCC substrate. In view of the relatively quick fabrication times for LTCC substrates, a designer typically will create a new design for the LTCC substrate and submit that new design for fabrication. Upon completing the modification task in step 550, a loop is followed to step 540 and the process begins anew.

In step 555, a prototype microwave circuit for the selected application is achieved by combining the MMIC array with the LTCC substrate. Interconnections between the MMIC array and the LTCC substrate determine the selected applications supported by the MMIC array. Although the MMIC array is capable of supporting more than one application, the LTCC substrate is designed to support a specific application, each possible application supported by the MMIC array has a corresponding LTCC substrate to achieve that microwave circuit application.

In step 560, an inquiry is conducted to determine whether a new application is selected from the set of possible applications. If so, the "YES" branch is followed from step 560 to step 520. The design process is started anew based upon the allocation of passive components to a new LTCC circuit for the newly selected application.

If a new circuit application is not desired, the design process terminates at the END step 565.

Figure 6:
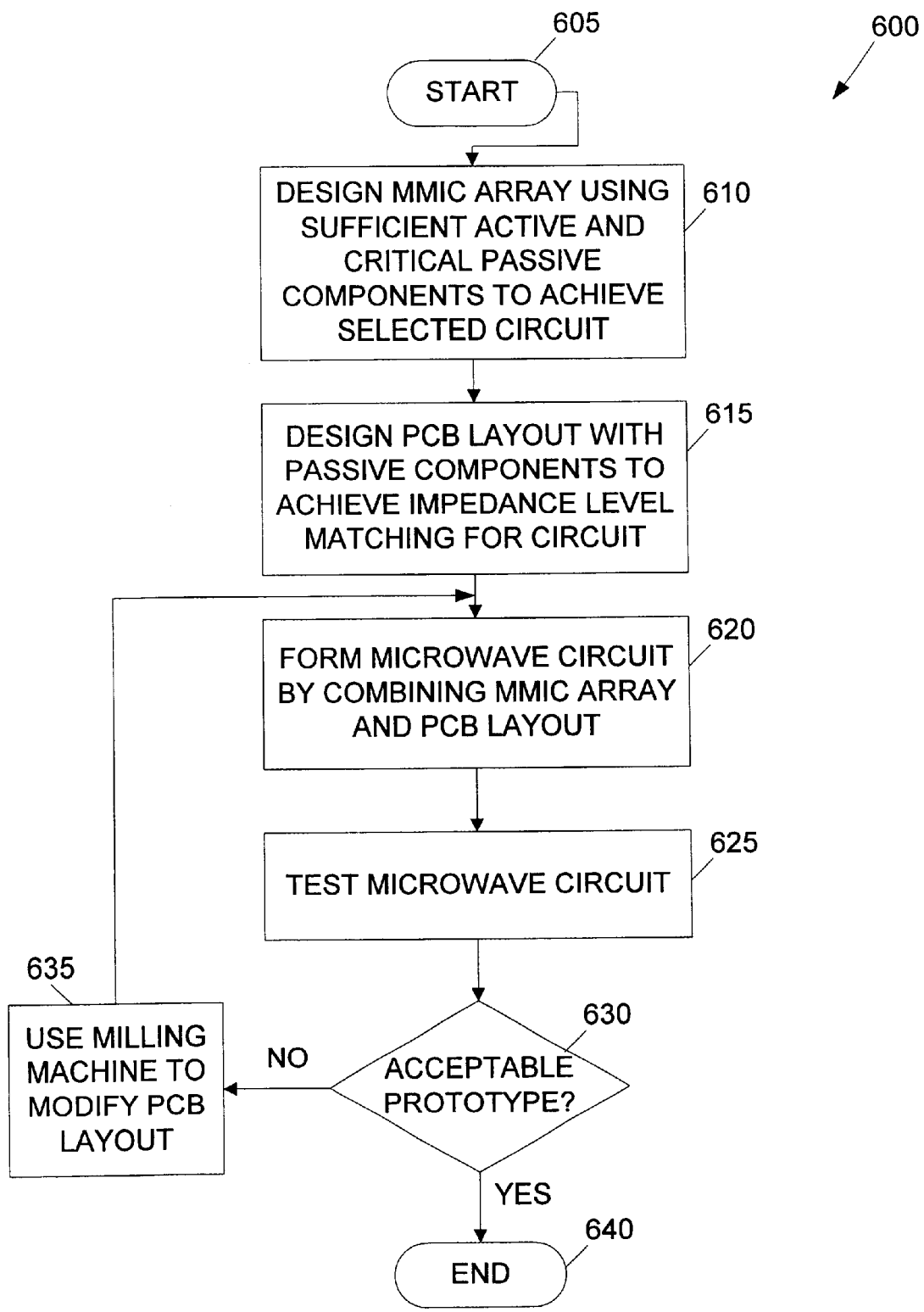
FIG. 6 is a flow chart diagram illustrating the steps of a design process for achieving RF and microwave integrated circuits in accordance with an alternative exemplary embodiment of the present invention.

FIG. 6 is a logical flow chart diagram illustrating a design process for creating a microwave circuit in accordance with an alternative exemplary embodiment of the present invention. Turning now to FIG. 6, the exemplary design process 600 is initiated at the START step 605. A designer selects an application for the microwave circuit in the START step 605 to support the design of the MMIC array and a PCB layout. In contrast to the design process illustrated in FIG. 3, a PCB layout rather than an LTCC substrate is used to provide interconnections between passive and active components of the microwave circuit. The PCB layout comprises only passive components whereas the MMIC array typically comprises both active and passive components. The designer can etch the PCB layout to achieve the desired passive components within the surface PCB material.

In step 610 a designer designs an MMIC array using sufficient active components and critical passive components to achieve the desired circuit. The designer in step 615 designs the PCB layout based upon the remaining passive components required to achieve an impedance level matching for the microwave circuit. These passive components also can be used to support filtering and biasing function.

In step 620, the microwave circuit is formed by combining the MMIC array with the PCB layout. Interconnections between the MMIC array and the PCB layout can be achieved via conductive paths, such as wired connections.

In step 625, the microwave circuit formed by the combination of the MMIC array and the PCB layout is tested to compare performance measurements to design criteria. In decision step 630, an inquiry is conducted to determine whether the prototype microwave circuit is acceptable based upon the evaluation conducted in step 625. If the prototype microwave circuit is acceptable, the "YES" branch is followed from the decision step 630 to the END step 640. The design process terminates at the END step 640.

If the prototype microwave circuit is not acceptable, the "NO" branch is followed from decision step 630 to step 635. In step 635, the designer can use a milling machine to modify the trace structure of the passive components on the PCB layout to adjust the circuit layout. For example, the quick circuit system Model 5000 manufactured by T-Tech, Inc. of Atlanta, Ga. can be used to mill the PCB layout. Additional information about the T-Tech quick circuit system is available at www.t-tech.com/products/quickcircuit. Upon completing the milling operation, a loop is followed from step 635 to step 620 and the process begins anew.

Figures 7A, 7B:
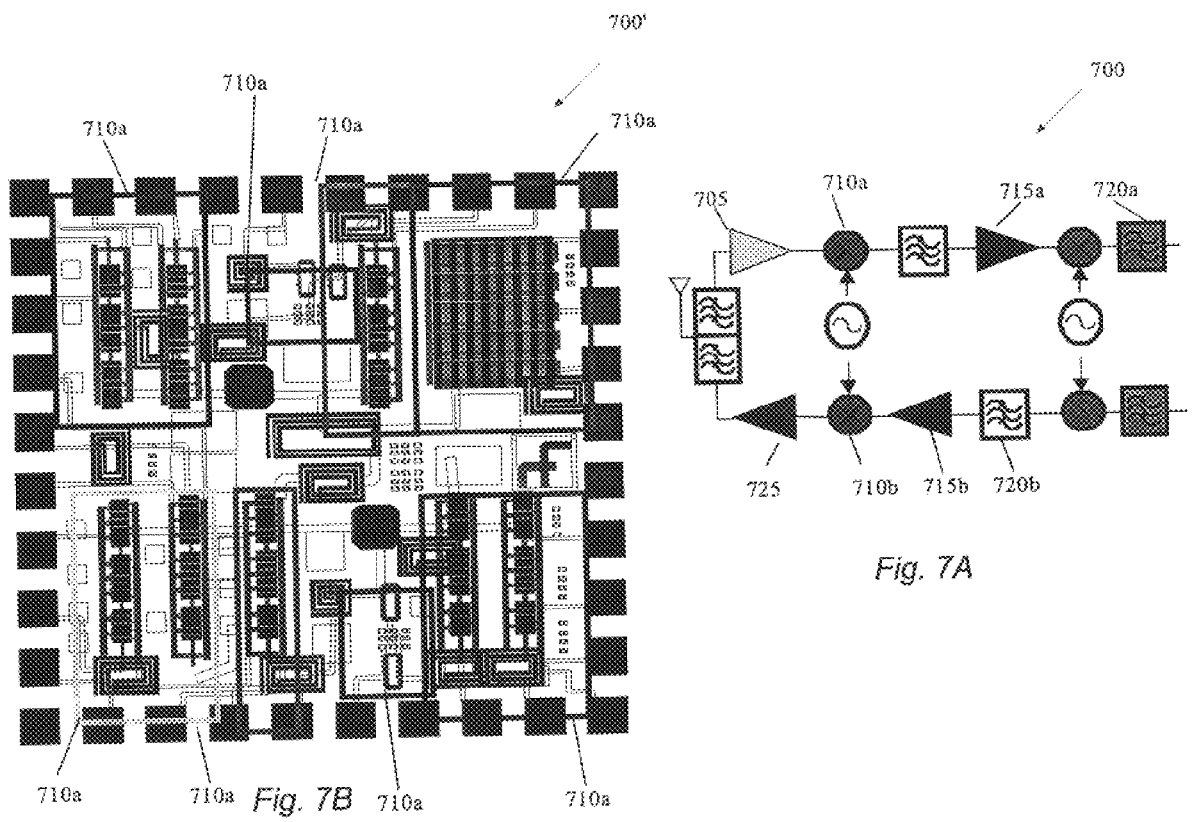
FIG. 7A is a schematic for a conventional dual-conversion transceiver comprising active and passive components.
FIG. 7B is a top view of an integrated circuit layout for achieving the dual-conversion transceiver shown in FIG. 7A in accordance with an exemplary embodiment of the present invention.

FIG. 7A is a schematic illustrating a conventional circuit design for a transceiver. FIG. 7B is an illustration of a monolithic microwave integrated circuit comprising an MMIC array and an LTCC substrate. The conventional transceiver circuit 700 illustrated in FIG. 7A comprises a receives section and a transmit section. The receive section comprises a low noise amplifier 705, an RF mixer 710a, an amplifier 715a, an IF mixer 720a, and filters. The transmit section comprises an IF mixer 720b, an amplifier 715b, an RF mixer 710b, a power amplifier 725 and filters. For this dual conversion transceiver design, the low noise amplifier 705 comprises two FETs, the power amplifier 725 comprises three FETs, the RF mixer 710a(b) comprises four diodes, the amplifier 715a(b) comprises two FETs, and the IF mixer 720a(b) comprises one FET, each placed on the MMIC array. The filters are preferably implemented by passive components of the LTCC substrate. Referring to FIG. 7B, the transmit section is located on the top half of the MMIC array and the receive section is placed on the bottom half of the MMIC array.

As shown in FIG. 7B, the transceiver circuit layout 700' comprises a transmit section and a receive section. The transmit section, located on the top-half of the circuit layout, includes (from left to right): the amplifier 715b, the RF mixer 710b, the IF mixer 720b, and the power amplifier 725. the circuit layout for the receive section comprises (from left to right): a low noise amplifier 705, the IF mixer 720a, the RF mixer 710a, and the amplifier 715a. The building blocks for the RF mixers, the IF mixers, and the amplifiers can be reused for the receive and transmit functions.

Figure 8:
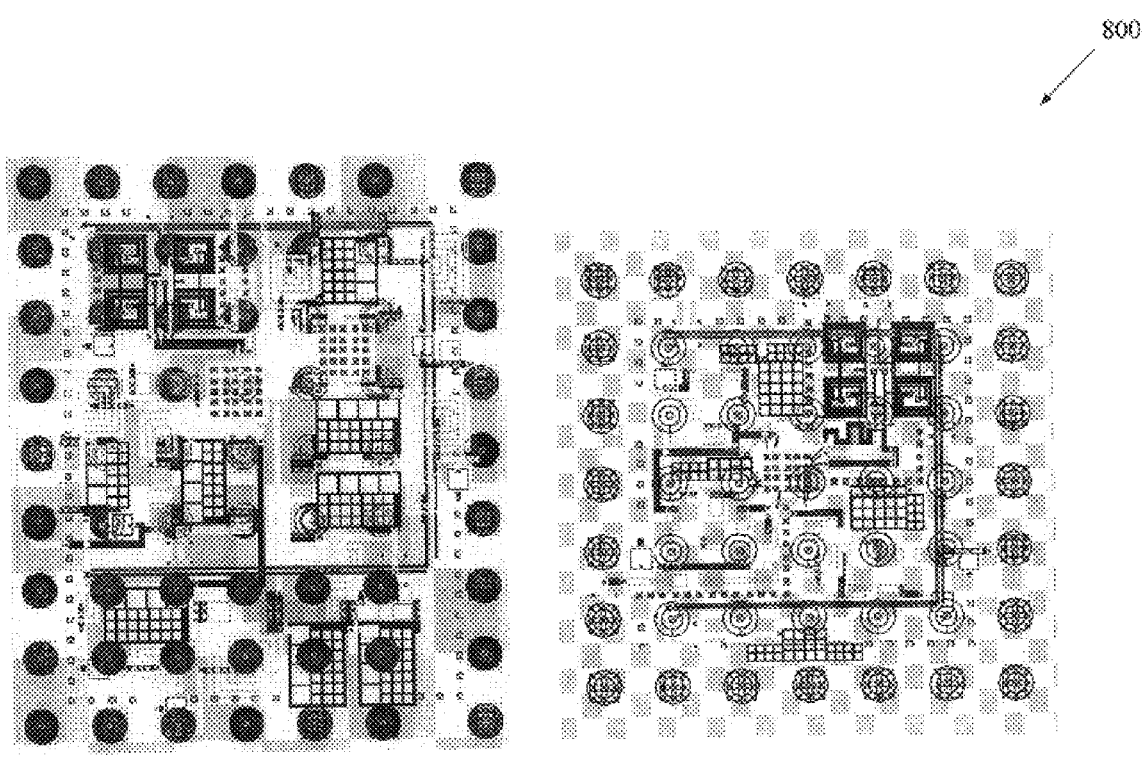
FIG. 8 is a top view of an MMIC layout for an MMDS transceiver constructed in accordance with an exemplary embodiment of the present invention.

FIG. 8 is a monolithic microwave integrated circuit layout for an MMDS transceiver constructed in accordance with an exemplary embodiment of the present invention. FIG. 8 illustrates the component layout for an MMDS transceiver circuit 800 comprising a receive section and a transmit section. The receive section is located on the left hand side of the circuit layout, whereas the transmit section is located on the right hand side of the circuit layout. FET and diode characteristics are adjustable on the wafer by trimming interconnects useful for modifying the sizes of the transistors and the diodes. For example, the size of a FET gate can be adjusted by breaking a single connection among multiple fingers of the gate layout. The separation of the fingers for a FET layout is sufficient to allow for laser trimming of the connections.

Another alternative exemplary embodiment of the present invention represents an intermediate state between a complete MMIC and the aforementioned embodiments described above in FIGS. 1–8. This alternative exemplary embodiment typically contains biasing resistors and matching components on a semiconductor die to better utilize the available space and passive components on the substrate. This alternative exemplary embodiment can achieve lower cost and improved performance of MMIC arrays.

A typical MMIC design includes many active devices, such as transistors and diodes, each requiring two to three wire bonding pads. Thus, there will be many bonding pads on a single die to bond the active devices with passive components on the substrate, such as a single layer substrate of alumina. Because of manufacturability issues, a designer is required to leave some physical space between the pads. To efficiently utilize the space on the costly semiconductor die, the inventors have recognized an opportunity for placing at least some passive components in this available space on the semiconductor die. These passives must be connected to the active devices on the die; otherwise, they also would require bond pads to connect them to the alumina substrate.

Fabrication and layout rules provided by the foundry further dictate that there will be some "empty" space on the various metal layers of the semiconductor die. The fabrication and layout rules define the minimum and maximum spacing between metals, implanted material, via holes, etc., in each layer for manufacturability purposes.

By meeting various layout rules for each layer, a designer often faces available space for use in different layers. If these layers are also used for a selected number of passives on the die itself, the available space on the die material is utilized efficiently for the fabrication cost. The alternative exemplary embodiment uses this available area on the semiconductor die to locate at least some passives while retaining the flexibility to generate different functions with the remaining passives places on the substrate.

The alternative exemplary embodiment differs from the embodiments discussed above with respect to FIGS. 1–8 in several ways, including the provision of a selected number of passives on the semiconductor die to achieve efficiency and reliability purposes. This alternative exemplary embodiment offers somewhat less design flexibility, however, as device sizes are determined at the design stage by considering a few design applications. In other words, the semiconductor die can be used to design functions for only certain applications, which reduces the assembly cost and improves yield while reducing design flexibility.

The exemplary embodiments mentioned in FIGS. 1–8 also include some substrate-implemented passives that are not connected with the active devices on a die. Consequently, each of those passives—inductors, capacitors, resistors, etc.—require at least two bond pads to connect them. This increases the number of bond pads.

However, the area used for bond pads does not support the functionality of a circuit because bond pads only provide a site to connect a MMIC with the substrate (alumina, LTCC, etc.). Also, bond pads are typically positioned at the boundary of the die to make the bonding process easier; internal pads are avoided as much as possible. An increased number of pads results in additional empty areas between the pads, which conflicts with the advantage of efficient use of layout space offered by this alternative exemplary embodiment.

In addition, the embodiments described in FIGS. 1–8 use flexible passives and an array of active devices, which may be trimmed to achieve certain functionality. For example, for a particular application, the designer needs to use a FET that has 300 um of gate length. In order to support that size of the gate length, he laser cuts the device (FET) array to realize a device of that size.

Laser cutting requires precision control, is expensive and can damage the die. For high volume production, laser-cutting process is expensive and can significantly reduce the yield of a fabricated design.

In view of the forgoing, it will be understood that a MMIC design fabricated with the process of the alternative exemplary embodiment requires forward thinking to select the active and passive components for the semiconductor die and the substrate. The designer usually must consider various design constraints in the layout of active and passive components.

For example, the use of numerous bonding pads on a MMIC is not an efficient use of the alternative exemplary embodiment of the present invention. Therefore, passives on the MMIC are preferably connected with the active devices, internally. Passives on the semiconductor die take far less area than on the ceramic substrate because semiconductor foundries allow very fine lithography. Thus, there is an advantage of using available space on the die to place passives so that overall system size is reduced.

The designer also should also consider the package size. For a representative 9 mm×9 mm standard LPCC package, the designer should estimate the size of ceramic passives and MMICs. For this example, passives supporting design flexibility are preferably placed on the IC, while passives that restrict the flexibility of functional blocks and applications should be placed on the substrate.

For a representative circuit example, designed with the alternative exemplary embodiment, a two-stage amplifier can be used as an LNA, RF Amplifier, Buffer Amplifier, etc. The intermediate matching between two active devices is preferably placed on the FlexiCore IC. The example amplifier can be used in various frequency bands by changing the values of the passive components for input and output matching. This input and output matching is preferably placed on the ceramic substrate using the improved FlexiCore design process. The cascade pair of devices can be used as an LNA, a Dual Gate Active Mixer, a Frequency Doubler, an RF Amplifier, etc., at different frequency bands by changing input and output matching.

If the application requires changes in biasing, one can use resistors on the substrate in parallel to change the biasing of the cascade pair. Bias resistors on the semiconductor die are preferably chosen to provide for the flexibility of changing circuit biasing by the addition of resistors in parallel on the substrate at a later stage. One preferably places as many capacitors as possible on the semiconductor die if a single-layer ceramic substrate is selected because, in this case, a surface mount capacitor is larger (10 mils×10 mils or more) than the capacitors on the semiconductor substrate (or die) (usually, less than 4 mils×4 mils), even for larger values.

Inductors can occupy a large portion of real estate for a MMIC and can increase the cost of a chip design. Inductors on a substrate are larger than corresponding inductors for a MMIC; however, the cost of ceramic is inexpensive for the placement of inductors on a ceramic substrate, such as alumina. Inductors on ceramic provide higher performance than inductors on MMIC because they have higher Q (quality factor) comparatively. Therefore, inductors are preferably placed on the ceramic substrate where possible.

In summary, the designer typically must consider a variety of variables to optimize a MMIC design when using the alternative exemplary embodiment. In general, a preferred design practice is to design numerous small ICs using the alternative exemplary embodiment rather than designing a single large IC in view of the number of required bond pads. An optimization process determines the size and the types of functional circuit blocks for the design. A FlexiCore-implemented design typically provides a standard functional block that can be used for various applications.

Figure 9:
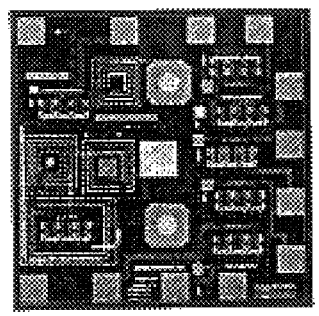
FIG. 9 illustrates an exemplary MMIC implemented by an alternative exemplary design process of the present invention.
Figure 10A:
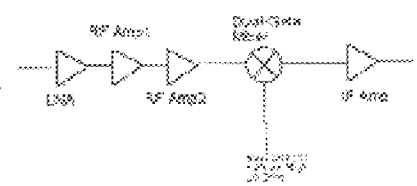
FIGS. 10A and 10B illustrate possible exemplary circuit applications for the MMIC described in FIG. 9.
Figure 10B:
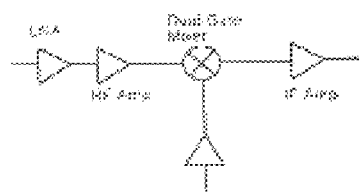

One example of a MMIC implemented by the alternative exemplary design process is show in FIG. 9 with possible circuit applications illustrated in FIGS. 10A and 10B.

The example semiconductor die of FIG. 9 can be used between 2 to 6 GHz because the LNA's interstage matching is optimized for operation in that frequency band for the lowest possible noise figure. The square and rectangular coils are inductors and the white shaded lines are resistors used for biasing and matching. This die allows one to design a receiver front-end, as shown in FIGS. 10A and 10B.

As illustrated in FIGS. 11 and 12, the dies are compact and can be utilized for a variety of applications. The first die shown in FIG. 11 is designed on GaAs technology while the second die is shown in FIG. 12 is designed in SiGe, which shows the ability to combine more than one technology in MCM.

Figure 13:
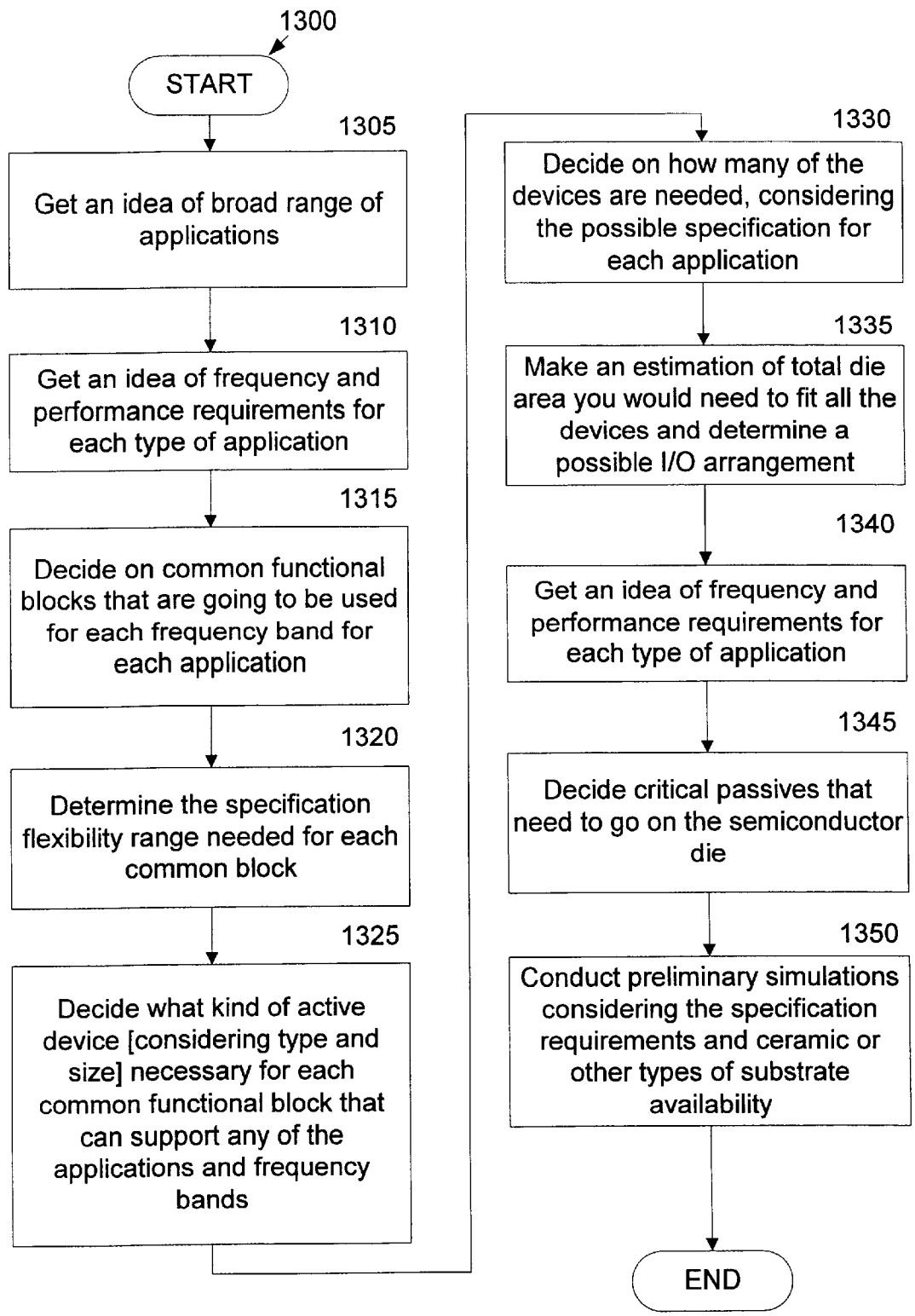
FIG. 13 is a logic flow diagram illustrating an exemplary method for designing exemplary MMICs that comprise an intermediate state between a complete MMIC and the aforementioned embodiments described above in FIGS. 1–8.

FIG. 13 illustrates a method 1300 for designing the alternative exemplary embodiments described in FIGS. 9–12. Certain steps in the process described below must naturally precede others for the present invention to function as described. However, the present invention is not limited to the order of the steps described if such order or sequence does not alter the functionality of the present invention. That is, it is recognized that some steps may be performed before or after other steps without departing from the scope and spirit of the present invention.

Step 1305 is the first step in the process: Get an idea of broad range of applications that are desired to be implemented.

Step 1310, get an idea of frequency and performance requirements for each type of application.

Step 1315, decide on common functional blocks that are going to be used for each frequency band for each application.

Step 1320, determine the specification flexibility range needed for each common block. For example, an amplifier needed to be used in any of the applications and frequency bands should have gain range from 6 dB to 20 dB, Input P1 dB range from −5 dBm to 10 dBm, etc.

Step 1325, decide what kind of active device [considering type and size] necessary for each common functional block that can support any of the applications and frequency bands.

Step 1330, decide on how many of the devices are needed, considering the possible specification for each application. For example, in X application receiver, only 4 gain blocks may be needed, which may require only 7 active devices considering the specification. In Y application receiver, 7 gain blocks may be needed, which may require 9 active devices. From these two considerations, decide how many active devices needed to meet the specifications. It may be 9 or sometimes even more or less. This step may require some optimization or iteration.

Step 1335, decide how many uncommon extra devices you would need to support all of the applications.

Step 1340, make an estimation of total die area you would need to fit all the devices and determine a possible I/O arrangement.

Step 1345, decide critical passives that need to go on the semiconductor die. For example, if the common blocks have common biasing, then connect biasing resistors on die to meet the specifications. If the critical passives cannot be placed on the semiconductor die, decide how the biasing scheme can be on the same chip and, if at later stage, a biasing scheme is needed, it can be changed by having other passives from ceramic substrate connected in series and/or parallel.

Also decide what kind of matching passive components can go on, chip while not needing extra area on die (use unused space on die), meeting specs and leaving flexibility to meet specs for various applications, etc. For example, many times interstage matching in an amplifier may go on chip. However, this process requires optimization considering variables such as die area, specification requirement, flexibility, I/O complexity and density, etc. A designer should try to avoid laser cutting, and many on chip wire bonding because it adds manufacturing cost, lowers yield, and consumes time and resources.

As suggested by Step 1350, the process may require some preliminary simulations considering the specification requirements and ceramic or other types of substrate availability. While making trade offs between what goes on chip and what goes on substrate, a designer should consider various performance, cost, and time related trade offs. Some passives on substrate can give better performance but may take more area. Some passives have to go on semiconductor die due the performance sensitivity.

Some of the functions that can be implemented using the alternative exemplary embodiment described in FIGS. 9–13 include, but are not limited to, the following: Amplifiers, Power Amplifiers, Low Noise Amplifiers, Frequency Mixers, Variable Gain Amplifiers, Frequency Multipliers, Voltage Control Oscillators, Power Detectors, Switches, etc. This alternative exemplary embodiment offers flexibility in some of the following areas: Frequency band of operation, Block (each function mentioned in above section) level and system level performance, Application, Block Rearrangement to meet application specific system architecture.

In view of the foregoing illustrative and exemplary embodiments, it will be appreciated that the present invention provides a new technique to design and implement microwave circuits in a monolithic structure with lower recurring and non-recurring engineering costs and faster implementation time.

A designer can gain increased circuit layout flexibility and a reduced fabrication time period by developing an MMIC using an MMIC array and a multilayer substrate, such as a conventional alumina substrate, an LTCC substrate, a PCB equivalent, an HTCC substrate, a hybrid ceramic-organic substrate, or a glass substrate. Active components and necessary passive components are placed on the MMIC array.

In contrast, the multilayer substrate comprises only passive components to support matching, biasing, and filtering functions. To address different applications or performance issues, a designer can design and fabricate multiple multilayer substrates for combination with the same MMIC array. This design approach reduces the overall development time for an MMIC because typical multilayer substrates can be fabricated in just a few weeks, whereas a typical MMIC array may take months to fabricate.

What is claimed is:

1. A method for manufacturing an RF integrated microwave circuit comprising the steps of:

selecting a plurality of active device blocks for a monolithic microwave integrated circuit (MMIC) array that support multiple applications for the RE integrated microwave circuit, the applications comprising any one of an amplifier, an LNA, a gain block, a power amplifier, a mixer, an attenuator, a phase shifter, an up/down converter, and other RF functions allowing the RF integrated microwave circuit to support the multiple applications;

placing the plurality of active device blocks on a surface to create the MMIC array for improving the performance of the RF integrated microwave circuit application;

selecting one or more passive device blocks for achieving a desired impedance level of the RF integrated microwave circuit and that corresponds to one or more active device blocks of the MMIC array, the one or more passive device blocks supporting a least one application for the RF integrated microwave circuit, a location and arrangement of the passive devices being selected in a manner to improve the performance of the RF integrated microwave circuit application;

installing the one or more passive device blocks on one or more substrate layers spaced from and separate from the MMIC array as off chip matching for the application being supported by the passive device blocks, whereby flexibility of the RF integrated microwave circuit application is increased since passive matching supported by the passive device blocks can be changed and adjusted quickly by changing the substrate layers; and coupling the MMIC array having the active device blocks to the one or more substrate layers supporting the passive device blocks.

2. The method of claim 1, further comprising the step of coupling a first set of active device blocks together on the surface while leaving a second set of active devices uncoupled from the first set in order to form the RF integrated microwave circuit.

3. The method of claim 1, further comprising the step of providing additional substrate layers having one or more passive device blocks for supporting other applications of the circuit.

4. The method of claim 1, further comprising the steps of:

choosing one or more primary applications for the integrated microwave circuit that reduces a number of secondary applications for the microwave circuit; and coupling a first set of active device blocks together while leaving a second set active device blocks uncoupled to form an RF integrated microwave circuit that supports the one or more primary applications.

5. The method of claim 1, further comprising the step of installing one or more passive device blocks adjacent to and on a same chip of the active device blocks of the MMIC array.

6. The method of claim 1, further comprising the step of testing the MMIC array separately prior to connecting it to the one or more substrate layers having the passive device blocks.

7. The method of claim 1, further comprising the step of separately testing the one or more substrate layers having the passive device blocks prior to coupling them to the MMIC array.

8. The method of claim 1, further comprising the step of testing the microwave circuit after coupling the MMIC array to the one or more substrate layers.

9. The method of claim 1, further comprising the step of modifying at least one of the active device blocks of the MMIC array and the one or more substrate layers to achieve a desired performance of the microwave circuit.

10. The method of claim 1, further comprising the step of minimizing crosstalk between active device blocks in the MMIC array by minimizing trace lengths between active device blocks and wirebond pads.

11. The method of claim 1, further comprising the step of reducing parasitic interference between active device blocks and a ground by centrally positioning a via within the MMIC array.

12. The method of claim 1, wherein the step of installing the one or more active device blocks further comprises the step of installing at least one of transistors and diodes.

13. The method of claim 1, wherein the step of installing the one or more active device blocks further comprises the step of installing the active device blocks with fingers of a first length, the method further comprising the step of adjusting functional characteristics of the active device blocks by trimming one or more of the fingers to a second length.

14. The method of claim 1, wherein the step of installing the one or more passive device blocks further comprises the step of installing at least one of inductors and capacitors.

15. The method of claim 1, wherein the step of installing the one or more passive device blocks on one or more substrate layers further comprises the step of installing the one or more passive device blocks on one or more low temperature co-fired ceramic substrates (LTCCs).

16. The method of claim 1, wherein the step of installing the one or more passive device blocks on one or more substrate layers further comprises the step of installing the one or more passive device blocks on at least one of printed circuit boards (PCBs), high temperature co-fired ceramics (HTCCs), hybrid ceramic-organic substrates, and glass substrates.

17. The method of claim 1, further comprising the step of forming a via within the one or more substrate layers.

18. The method of claim 10, wherein the step of forming a via further comprises the step of extending a plated-through channel through one or more of the substrate layers.

* * * * *